(12) United States Patent
Kato et al.

(10) Patent No.: US 7,026,099 B2
(45) Date of Patent: Apr. 11, 2006

(54) PATTERN FORMING METHOD AND METHOD FOR MANUFACTURING SEMICONDUCTOR DEVICE

(75) Inventors: Hirokazu Kato, Yokohama (JP); Yasunobu Onishi, Yokohama (JP); Eishi Shiobara, Inagi (JP); Daisuke Kawamura, Yokohama (JP); Hiroko Nakamura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 89 days.

(21) Appl. No.: 10/419,921

(22) Filed: Apr. 22, 2003

(65) Prior Publication Data

US 2003/0215749 A1 Nov. 20, 2003

(30) Foreign Application Priority Data

Apr. 24, 2002 (JP) ............................. 2002-122862

(51) Int. Cl.
*G03F 7/00* (2006.01)

(52) U.S. Cl. ...................................... 430/313

(58) Field of Classification Search ............. 430/270.1, 430/311, 312, 313, 314
See application file for complete search history.

(56) References Cited

U.S. PATENT DOCUMENTS

| 4,396,704 A | * | 8/1983 | Taylor | 430/311 |
| 6,007,963 A | * | 12/1999 | Felter et al. | 430/271.1 |
| 6,569,595 B1 | * | 5/2003 | Sato et al. | 430/270.1 |
| 6,569,761 B1 | * | 5/2003 | Chang | 438/637 |

FOREIGN PATENT DOCUMENTS

| JP | 60-14238 | 1/1985 |
| JP | 60-119549 | 6/1985 |
| JP | 60-212757 | 10/1985 |
| JP | 61-3139 | 1/1986 |
| JP | 61-7835 | 1/1986 |
| JP | 61-289345 | 12/1986 |
| JP | 62-159142 | 7/1987 |
| JP | 62-212644 | 9/1987 |
| JP | 62-229136 | 10/1987 |
| JP | 62-229141 | 10/1987 |
| JP | 5-267253 | 10/1993 |
| JP | 6-67404 | 3/1994 |
| JP | 7-135140 | 5/1995 |
| JP | 09-190959 | * | 7/1997 |
| JP | 2686448 | 8/1997 |
| JP | 2002-110510 | 4/2002 |

OTHER PUBLICATIONS

H. Watanabe et al. "Self-Developing Properties of an Inorganic Electron Beam Resist and Nanometer-Scale Patterning Using a Scanning Electron Beam", Jpn. J. Appl. Phys., vol. 34, No. 12B, pp. 6950-6955, (Dec. 1995).

T. Wada et al., "$SiO_2$/Poly-Si Multilayered Electron Beam Resist Process for Fabrication of Ultrasmall Tunnel Junctions", Jpn. J. Appl. Phys., vol. 34, No. 12B, pp. 6961-6965. (Dec. 1995).

S. Gorwadkar et al., "$SiO_2$ /c-Si Bilayer Electron-Beam Resist Process for Nano-Fabrication", Jpn. J. Appl. Phys., vol. 35, No. 12B, pp. 6673-6678, (Dec. 1996).

G. Dabbagh et al., "Capabilities and Limitations of Plasma Polymerized Methylsilane (PPMS) All-Dry Lithography", Journal of Photopolymer Science and Technology, vol. 11, No. 4, pp. 651-662, (1998).

T. Morisawa et al., "Bilayer Resists Process for ArF Lithography", Journal of Photopolymer Science and Technology, vol. 11, No. 4, pp. 667-672, (1998).

M. Sakata et al., "Chemically Amplified Resist Convertible Into Inorganic Silicate Glass (GPR)", SPIE, vol. 2438, pp. 775-787, (1995).

J. Hatakeyama et al., "Investigation of Discrimination Enhancement in Polysilsesquioxane Based Positive Resist for ArF Lithography", SPIE, vol. 3333, pp. 62-72, (1998).

Copy of Chinese Office Action dated Apr. 8, 2005 in counterpart Chinese Application No. 031221386 and its English translation.

* cited by examiner

*Primary Examiner*—Kathleen Duda
(74) *Attorney, Agent, or Firm*—Finnegan, Henderson, Farabow, Garrett & Dunner, L.L.P.

(57) ABSTRACT

A pattern forming method is disclosed which comprises providing a to-be-processed film on a substrate, providing a resist film on the to-be-processed film, patterning the resist film, providing a film of a radiosensitive compound on the to-be-processed film such that the patterned resist film is covered with the film of the radiosensitive compound, subjecting the film of the radiosensitive compound to irradiation and a development process, thus exposing an upper surface of the resist film and patterning the film of the radiosensitive compound, and removing the resist film and processing the to-be-processed film, using the patterned film of the radiosensitive compound as a mask.

18 Claims, 9 Drawing Sheets

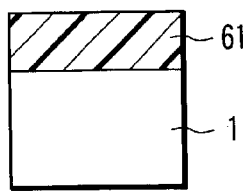
F I G. 12A
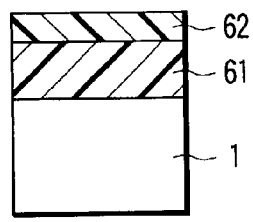
F I G. 12B
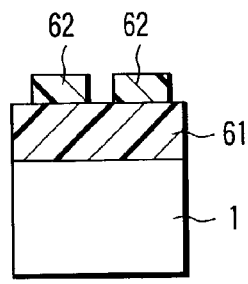
F I G. 12C
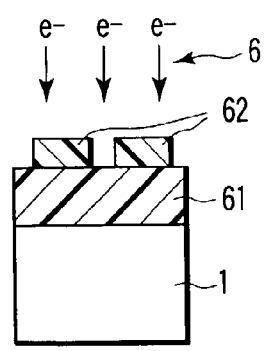
F I G. 12D
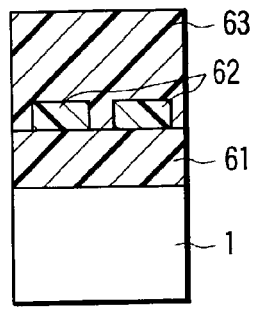
F I G. 12E
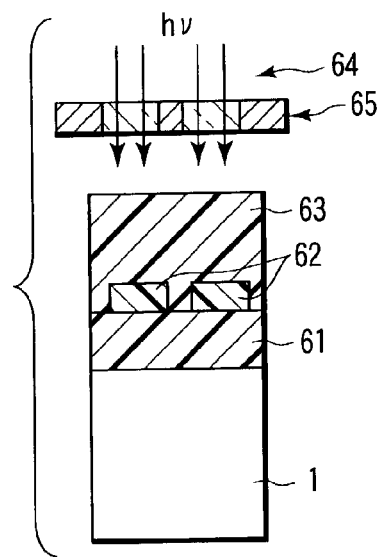
F I G. 12F
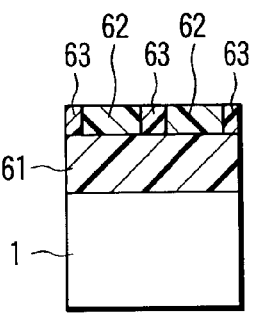
F I G. 12G
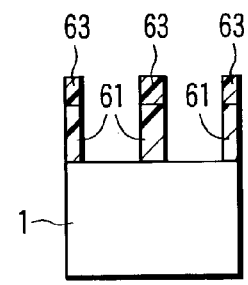
F I G. 12H

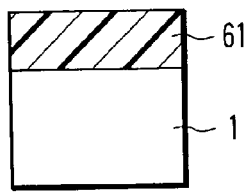
F I G. 14A
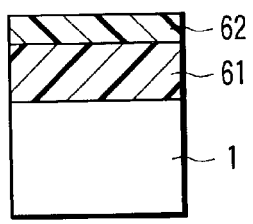
F I G. 14B
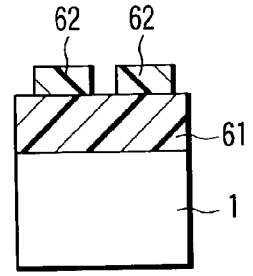
F I G. 14C
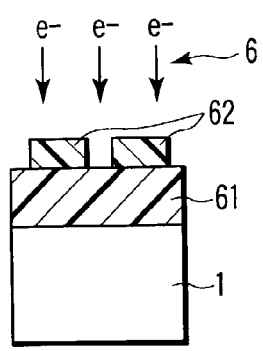
F I G. 14D
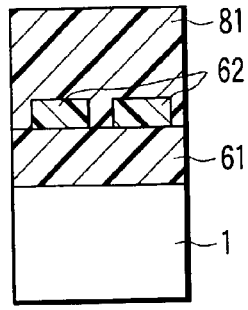
F I G. 14E
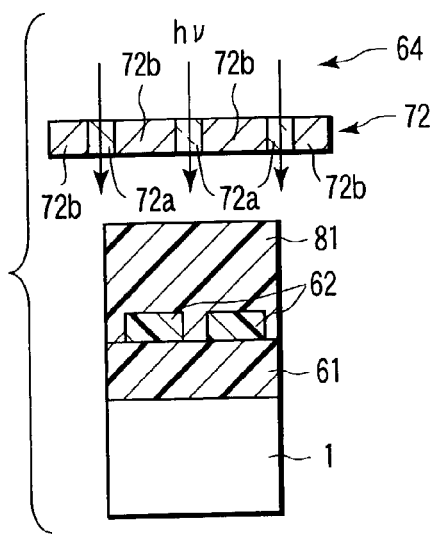
F I G. 14F
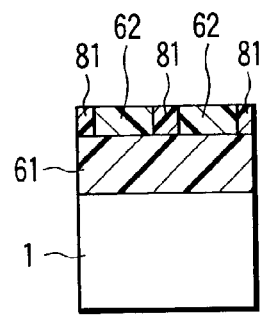
F I G. 14G
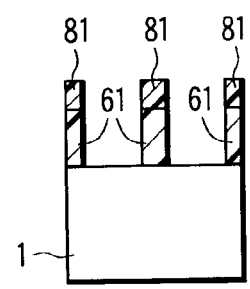
F I G. 14H

PATTERN FORMING METHOD AND METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2002-122862, filed Apr. 24, 2002, the entire contents of which are incorporated herein by reference.

BACKGROUND OF THE INVENTION

1. Field of the Invention

The present invention relates generally to a pattern transfer process, and more particularly to a pattern forming method with improved processing precision for a to-be-processed film on which a pattern is to be transferred, and a method of manufacturing a semiconductor device using a pattern formed by this pattern forming method.

2. Description of the Related Art

In general, in a lithography step in a series of steps of a semiconductor device manufacturing process, a resist pattern is used as a mask for dry etching in order to process a to-be-processed film lying under the mask. The resist film is thus required to have high performance in both resolution and resistance to dry etching. In recent years, special attention has been paid to a $F_2$ laser as one of next-generation lithography techniques. The $F_2$ laser, however, has a very short wavelength, and it is very difficult to develop a resist film having a high light transmittance for such a very short wavelength. In this situation, in order to increase the light transmittance, there is no choice but to decrease the thickness of the resist film. If the resist film is thinned, however, the resistance of the resist film to dry etching decreases, and it becomes difficult to achieve high performance both in the resistance to dry etching and the resolution.

Further, in a resist pattern forming method using a low-acceleration electron beam instead of a laser, the distance of transmission of an electron beam in the resist film is short. It is thus difficult to increase the thickness of the resist film.

A solution to these problems is a multi-layer resist process. There are various methods for the multi-layer resist process. In particular, there is an effective method wherein a dry-etching-resistant material is buried in a resist pattern, and the buried material is used as a mask in transferring a pattern onto the underlying film. This method is very hopeful since the resist film is not required to have dry-etching resistance at all, and research and development of resist films can be focused on enhancement of resolution.

Jpn. Pat. Appln. KOKAI Publication No. 7-135140, for instance, discloses an invention wherein SOG (Spin on Glass), which is a coat-type silicon material, is coated on a resist pattern, and the SOG is etched back until an upper part of the resist pattern is exposed.

The above-described method using the buried material, however, has the following problem.

FIG. 16A to FIG. 16C show cases where buried resist films used as buried material are thin. FIG. 16A is a cross-sectional view showing a resist pattern formed as a so-called line and space pattern (L/S pattern) 101a. FIG. 16B is a cross-sectional view showing a resist pattern formed as a so-called isolated line pattern (iL pattern) 101b. FIG. 16C is a cross-sectional view showing a resist pattern formed as a so-called isolated space pattern (iS pattern). This is similar to FIGS. 17A to 17C and FIGS. 18A to 18C to be described later. In cases where buried resist films 102 are thin, as shown in FIGS. 16A to 16C, the step coverage of the buried material is not sufficient, so some step height remains on the surfaces of buried resist films 102 in accordance with the shapes of resist patterns 101a to 101c.

FIGS. 17A to 17C depict the states near resist patterns 101a to 101c after etch-back of the thinly buried resist films 102 under the condition, "resist film etching rate>buried resist film etching rate." It is empirically understood that in general, a necessary etch-back amount (depth) of the buried resist film 102 is greatest at the residual part of the iS pattern 101c of the three patterns. However, if etch-back is performed so as to meet the required etch-back amount of the residual part of the iS pattern 101c, the thickness of the buried resist films 102 at the space portions of the L/S pattern 101a and iL pattern 101b becomes smaller than necessary, or reduces to zero. This would pose a problem in controlling processing dimensions when an underlying film 103 is processed.

An effective solution to the above problem relating to the step coverage of the buried resist film 102 is to increase the thickness of the buried resist film 102. FIGS. 18A to 18C show the states near resist patterns 101a to 101c in this case. The buried resist film 102 is formed to have a large thickness. Thereby, regardless of the shapes of resist patterns 101a to 101c, the surface of the buried resist film 102 is flattened substantially completely. In this case, however, it is difficult to control the in-plane uniformity in etch-back depth. In addition, if the thickness of the buried resist film 102 is increased, the process time for the etch-back increases. In particular, as regards the former problem, the tolerable range of variance in in-plane uniformity is narrowed as the thickness of the resist film 104 decreases. This may lead to failure in the application of ordinary etching techniques. The same also applies to the case of using the condition, "resist film (104) etching rate <buried resist film (102) etching rate."

BRIEF SUMMARY OF THE INVENTION

According to an aspect of the invention, there is provided a pattern forming method comprising: providing a to-be-processed film on a substrate; providing a resist film on the to-be-processed film; patterning the resist film; providing a film of a radiosensitive compound on the to-be-processed film such that the patterned resist film is covered with the film of the radiosensitive compound; subjecting the film of the radiosensitive compound to irradiation and a development process, thus exposing an upper surface of the resist film and patterning the film of the radiosensitive compound; and removing the resist film and processing the to-be-processed film, using the patterned film of the radiosensitive compound as a mask.

According to another aspect of the invention, there is provided a method of manufacturing a semiconductor device, comprising: providing a to-be-processed film on a substrate; providing a resist film on the to-be-processed film; patterning the resist film; providing a film of a radiosensitive compound on the to-be-processed film such that the patterned resist film is covered with the film of the radiosensitive compound; subjecting the film of the radiosensitive compound to irradiation and a development process, thus exposing an upper surface of the resist film and patterning the film of the radiosensitive compound; removing the resist film, processing the to-be-processed film and forming a pattern thereon, using the patterned film of the radiosensitive compound as a mask; and performing an etching process on the basis of the formed pattern.

BRIEF DESCRIPTION OF THE SEVERAL VIEWS OF THE DRAWING

FIG. 12A to FIG. 12H are cross-sectional views illustrating steps of a pattern forming method according to an eighth embodiment of the invention;

FIG. 14A to FIG. 14H are cross-sectional views illustrating steps of a pattern forming method according to a tenth embodiment of the invention;

DETAILED DESCRIPTION OF THE INVENTION

The present invention will now be described in detail referring to some embodiments as shown in the accompanying drawings.

(First Embodiment)

Figure 1A:
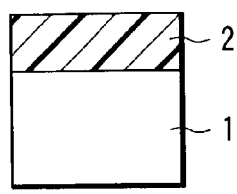
FIG. 1A to FIG. 1I are cross-sectional views illustrating steps of a pattern forming method according to a first embodiment of the present invention.
Figure 2:
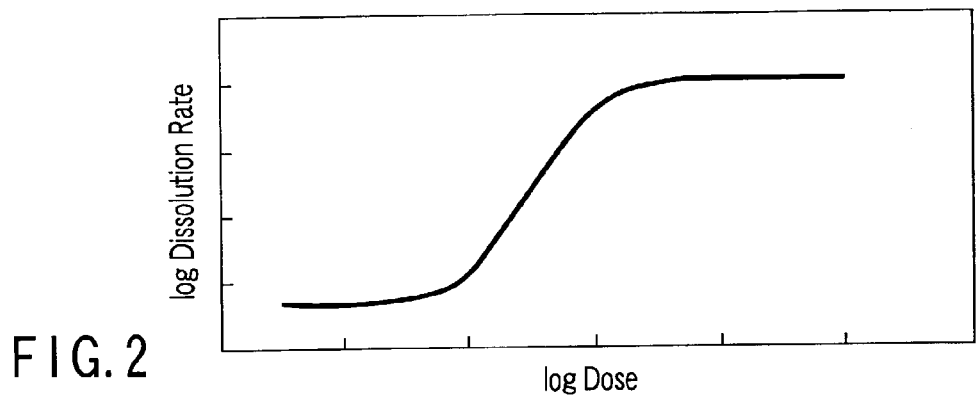
FIG. 2 is a graph showing the relationship between a resist dissolution rate and an exposure amount (dose)
Figure 3:
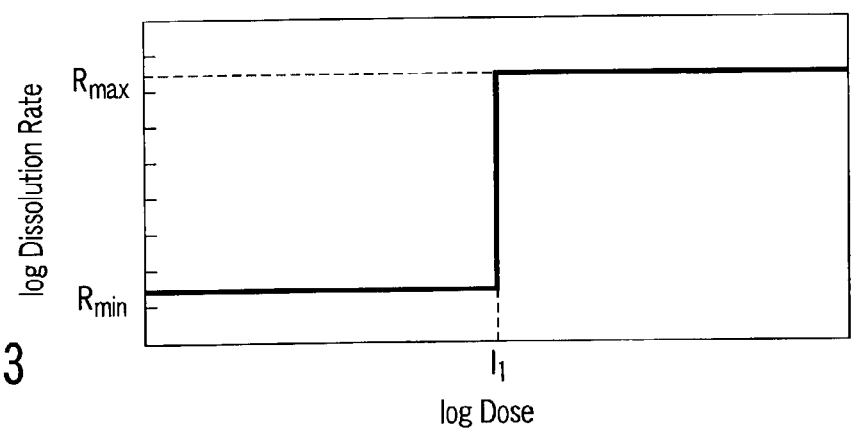
FIG. 3 is a graph simplifying the graph of FIG. 2 by binarization.
Figure 4:
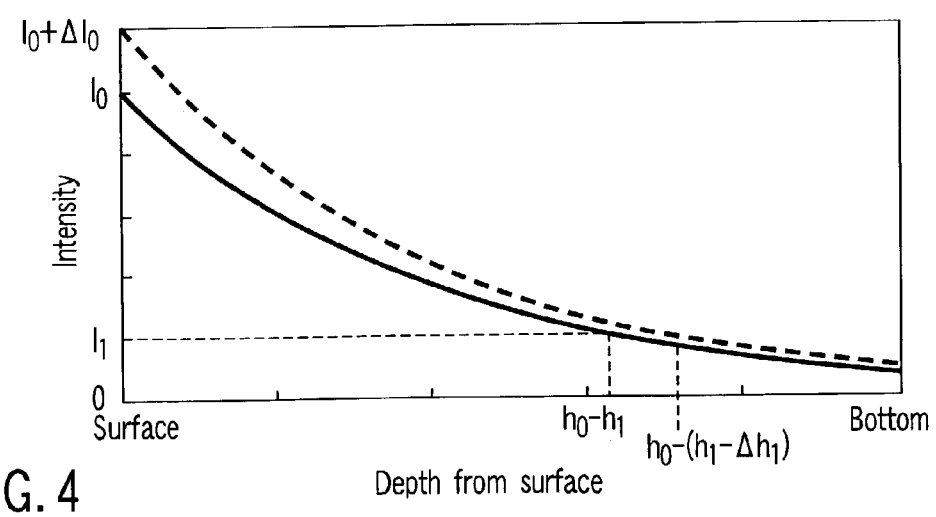
FIG. 4 is a graph showing a light intensity distribution in a depth direction in a case where a buried material is exposed with monochromatic light.
Figure 5:
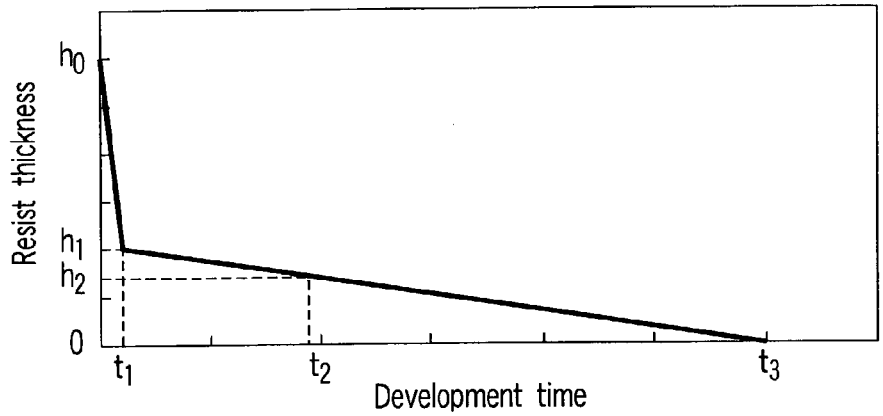
FIG. 5 is a graph showing the relationship between a development time of a buried material and a residual film thickness (resist thickness)
Figure 6:
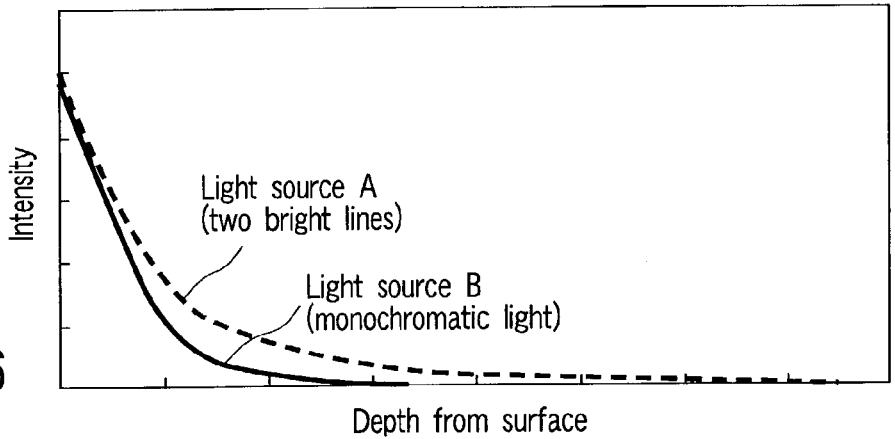
FIG. 6 is a graph showing a light intensity distribution in a depth direction in a case where a resist film is exposed with light components of plural wavelengths.

A first embodiment of the present invention will be described with reference to FIGS. 1A to 1I and FIGS. 2 to 6. FIG. 1A to FIG. 1I are cross-sectional views illustrating steps of a pattern forming method according to the first embodiment. FIG. 2 is a graph showing the relationship between a resist dissolution rate and an exposure amount (dose). FIG. 3 is a graph simplifying the graph of FIG. 2 by binarization. FIG. 4 is a graph showing a light intensity distribution in a depth direction in a case where a buried material is exposed with monochromatic light. FIG. 5 is a graph showing the relationship between a development time of a buried material and a residual film thickness (resist thickness). FIG. 6 is a graph showing a light intensity distribution in a depth direction in a case where a resist film is exposed with light components of plural wavelengths.

In the first embodiment, An ArF positive resist film is used as a resist film. A photosensitive polysilazane is used as a buried material. An ArF excimer laser is used as a light source for irradiating the buried material. A description of details will follow.

To begin with, a pattern forming method according to the first embodiment will be described. As is shown in FIG. 1A, a coat-type carbon film 2 manufactured by JSR Corp. (tradename: CT01) with a thickness of about 0.3 μm, which serves as a to-be-processed film (underlying film), is spin-coated on a semiconductor substrate (silicon substrate) 1 that is to be subjected to micro-manufacturing.

Figure 1B:
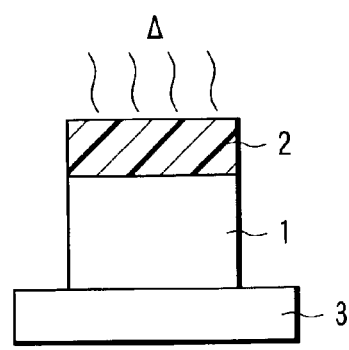

In the next step shown in FIG. 1B, the semiconductor substrate 1 provided with the coat-type carbon film 2 is placed on a hot plate 3 and baked at about 300° C. for about 120 seconds.

Figure 1C:
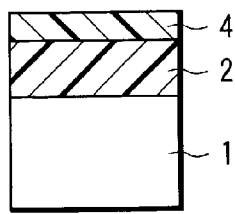

Subsequently, as shown in FIG. 1C, a positive-type ArF resist film 4 manufactured by JSR Corp. (tradename: ATB367S) with a thickness of about 120 nm, which serves as a resist film (upper resist film), is spin-coated on the baked coat-type carbon film 2. The positive-type ArF resist film 4 is then pre-baked.

Figure 1D:
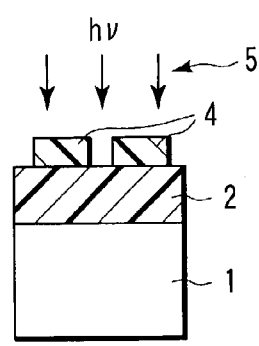

As is shown in FIG. 1D, an ArF excimer laser beam 5 irradiates on the positive-type ArF resist film 4, following which the resist film 4 is developed. Thereby, the positive-type ArF resist film 4 is patterned to have a resist pattern (upper resist pattern) with a desired shape and precision.

Figure 1E:
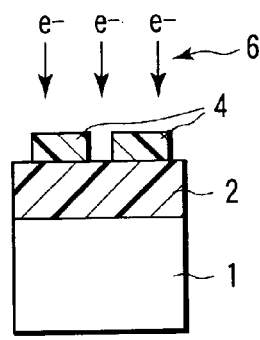

In a step illustrated in FIG. 1E, the patterned positive-type ArF resist film 4 is subjected to a process so as to have a resistance to a solvent of a radiosensitive compound used as a buried material (to be described later). This process is performed using one or more of electron beam irradiation, ultraviolet irradiation, radical irradiation, molecular beam irradiation and heat treatment. In the present embodiment, an electron beam (e⁻) 6 with 4 mC/cm² irradiates on the positive-type ArF resist film 4, thereby carrying out an EB (Electron Beam) curing process.

Figure 1F:
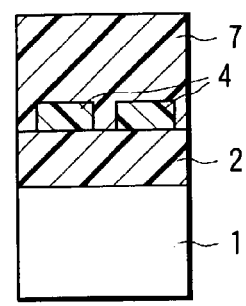

In the following step depicted in FIG. 1F, a film 7 formed of a radiosensitive compound as a buried material is provided on the coat-type carbon film 2 such that the EB-cured positive-type ArF resist film 4 is covered. The radiosensitive compound may be a compound containing one or more selected from the group comprising of a silicon atom (Si), a germanium atom (Ge), a tin atom (Sn) and a tungsten atom (W).

Specifically, the radiosensitive compound may be radiosensitive polysilane, radiosensitive polygermane, radiosensitive polystannane, radiosensitive polysilazane, radiosensitive polysiloxane, radiosensitive polycarbosilane, a radiosensitive disilanylene-π-electron series polymer, or a copolymer of two or more of these compounds. Alternatively, the radiosensitive compound may be a novolak resin including a silicon atom in a substitute group of a benzene ring, a polyhydroxystyrene resin including a silicon atom in a substitute group of a benzene ring, an acrylic resin derivative including a silicon atom, a methacrylic resin derivative including a silicon atom, a COMA (cyclo olefin maleic anhydride) resin derivative including a silicon atom, or polytungstic acid peroxide. Alternatively, the radiosensitive compound may be a mixture of any one of the above-mentioned compounds and a radiosensitive substance.

This enables the radiosensitive compound film 7 to function as an etching mask in etching the underlying film 2, and also makes it possible to control the thickness of the radiosensitive compound film 7 in recessing the radiosensitive compound film 7.

Radiosensitive compounds are classified into two types: positive-type radiosensitive compounds and negative-type radiosensitive compounds. Both types are usable. A positive-type radiosensitive compound, however, is more desirable in use than a negative-type radiosensitive compound. The reason is that in the case of using the positive-type radiosensitive compound, this compound may be provided with a radiation absorption function, whereby the recessing rate can be decreased in accordance with a depth from the surface of the radiosensitive compound film 7, as will be described later. In the case of using the positive-type radiosensitive compound, this property may be utilized to obtain a better result than in the case where the negative-type radiosensitive compound is used.

It is particularly pointed out that each of the above-mentioned radiosensitive compounds may become of a positive type or a negative type according to the kind of radiosensitive compound or the treatment process. For instance, a mixture of polysiloxane and o-naphthoquinone diazide, which is a radiosensitive compound, is a positive-type radiosensitive compound. On the other hand, a mixture of polysiloxane and a bis-azide compound, which is a radiosensitive compound, is a negative-type radiosensitive compound. In addition, a mixture of a polyhydroxystyrene resin, which is widely used as a KrF resist film, and a photo-acid generator agent is normally a positive-type radiosensitive compound. However, if the dose of light irradiation is excessively increased, the resin is cross-linked and the mixture becomes a negative-type radiosensitive compound.

In the present embodiment, a photosensitive polysilazane film 7 manufactured by Clariant (Japan) K.K. (tradename: PS-MSZ), which is formed of a positive-type radiosensitive compound, is used as the radiosensitive compound film. The photosensitive polysilazane film 7 with a thickness of about 500 nm is spin-coated on the coat-type carbon film 2. At this stage, the positive-type ArF resist film 4, which is patterned to have a resist pattern, is covered such that stepped portions of the pattern may be almost completely eliminated. Note that when the positive-type ArF resist film 4 (upper resist pattern) was covered with the photosensitive polysilazane film 7, it was not dissolved in propylene glycol monoethyl ether acetate (PGMEA), i.e. a solvent of the photosensitive polysilazane film 7.

Figure 1G:
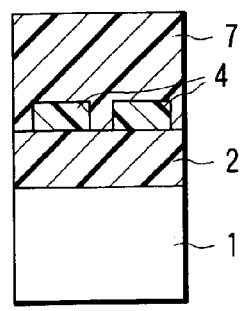

In a subsequent step shown in FIG. 1G, radiation (hv) 8 is applied to the photosensitive polysilazane film 7, thus exposing the entire surface of the photosensitive polysilazane film 7. The radiation 8 used for the exposure is one of a light beam, an electron beam and an ion beam. In the case where the light beam is used as the radiation 8, the light beam is one of infrared, visible light, ultraviolet, vacuum ultraviolet, extreme ultraviolet, and soft X-rays. In the present embodiment, an ArF excimer laser beam 8 with a wavelength of about 193 nm is used as the radiation for exposing the entire surface of the photosensitive polysilazane film 7. Note that in the exposure, the absorption coefficient of the photosensitive polysilazane film 7 for the wavelength of the ArF excimer laser beam 8 was about 6.5 $\mu m^{-1}$.

Figure 1H:
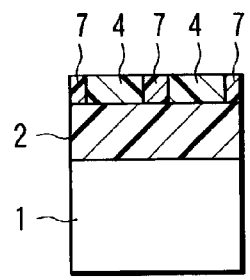

The photosensitive polysilazane film 7 is then subjected to humidifying treatment and then to development treatment so that the residual film after the development may have a thickness of about 100 nm. Thereby, the upper part (upper surface) of the positive-type ArF resist film 4 (upper resist pattern) is exposed, as shown in FIG. 1H. As a result, the photosensitive polysilazane film 7 has a pattern with a desired shape and precision. Note that the in-plane uniformity on the exposed surface (upper surface) of each of the positive-type ArF resist film 4 and photosensitive polysilazane film 7 after the development was within about 10 nm. In addition, the film decrease rate of the recess immediately before the end of development was about 1 nm/sec.

Figure 1I:
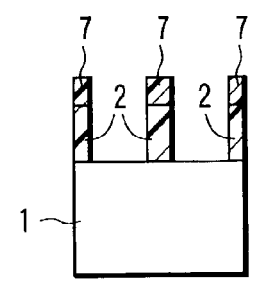

At last, as shown in FIG. 1I, using the photosensitive polysilazane film 7 as a mask, the positive-type ArF resist film 4 and coat-type carbon film 2, in the region where no photosensitive polysilazane film 7 is left, are removed by processing. Thereby, a pattern with a desired shape and precision can be formed in the coat-type carbon film 2 left on the semiconductor substrate 1.

There are two requirements that the radiosensitive compound should meet as the buried material.

One of the requirements relates to a dissolution rate of the radiosensitive compound at the time of the end of the developing process. A maximum tolerance value of an error from a target value of the residual film thickness of the radiosensitive compound film 7, at a time when the radiosensitive compound film 7 is developed to expose the upper part of the resist film 4, is set at $\Delta h_{total}$. The error in the residual film thickness occurs due to two main factors.

One of the factors is a variance in exposure amount (dose) at the time of performing all-surface exposure. Such a variance may degrade the in-plane uniformity of the surface of the radiosensitive compound 7. The other factor is controllability in development time. Assume that the dissolution rate of the surface of the radiosensitive compound film 7 at the time of the end of development is R and a time error is $\Delta t$. Then, the thickness value of the radiosensitive compound film 7 after the development deviates from the target value $R\Delta t$. Consequently, the reproducibility (uniformity) of the film thickness between wafers (not shown) deteriorates. Because of the requirement that the value $R\Delta t$, should not exceed $\Delta h_{total}$, the following formula is established:

$$R\Delta t \leq \Delta h_{total} \Leftrightarrow R \leq \Delta h_{total}/\Delta t \quad (1)$$

An estimated film thickness of the resist film 4 in the present embodiment is about 150 nm or less. According to experiments conducted by the inventors of the present invention, it is empirically understood that a minimum required residual film thickness of the radiosensitive compound film 7 is about 50 nm. Accordingly, a maximum value that the value $\Delta h_{total}$ can take is about 100 nm. If an error in development time is one second, the condition that the value R should meet is expressed by the following formula (2):

$$R \leq 100 \text{ nm}/s \quad (2)$$

This is the requirement for ensuring the controllability of the recess film thickness. The upper limit of the value R is further decreased in a case where the resist film 4 has a small film thickness, a variance in dose is large, or the uniformity in burying of the radiosensitive compound film 7 in the plane of the wafer is not good. According to experiments conducted by the inventors of the present invention, it is understood that the value R in this embodiment meets the condition of formula (2) and there is no problem.

The above-described requirement is applicable to both the positive-type radiosensitive compound and negative-type radiosensitive compound.

The second requirement relates to an absorption coefficient (absorptivity) of the positive-type radiosensitive compound. FIG. 2 shows a measurement curve of the dissolution rate of a typical resist film. For simpler handling of dissolution characteristics of the resist film, FIG. 3 shows a dissolution rate measurement curve obtained by simply binarizing the dissolution rate of the resist film shown in FIG. 2. In FIG. 3, $I_1$ denotes a dose at which the dissolution rate of the resist film changes, $R_{max}$ denotes a dissolution rate of the resist film when $I>I_1$, and $R_{min}$ denotes a dissolution rate of the resist film when $I<I_1$.

In FIG. 4, a solid line indicates a distribution of light intensity I in the depth direction in the case where the entire surface of the positive-type radiosensitive compound film 7 is exposed with monochromatic light. In FIG. 4, a graph plotted by a broken line indicates a distribution of light intensity I' in the depth direction in the case where an error $\Delta I_0$ is included in the irradiation amount (dose). In FIG. 4, symbol $h_0$ designates an initial film thickness of the positive-type radiosensitive compound film 7 as the buried material, and $h_1$ designates a film thickness of the positive-type radiosensitive compound film 7 from the interface of the to-be-processed film 2 in the case where the light intensity I becomes $I_1$ when the dose for all-surface exposure is $I_0$. In addition, $\Delta h_1$ is a difference between $h_1$ and a film thickness of the positive-type radiosensitive compound film 7 from the interface of the to-be-processed film 2 in the case where the light intensity I becomes $I_1$ when the dose for all-surface exposure is $I_0+\Delta I_0$. Besides, $\Delta I_0$ is an error in dose for all-surface exposure, and $I_1$ is equal to $I_1$ in FIG. 3.

FIG. 5 shows the relationship between the development time of the positive-type radiosensitive compound film 7 and the residual film thickness thereof. In FIG. 5, $h_0$ and $h_1$ are equal to $h_0$ and $h_1$ in FIG. 4. Symbol $h_2$ designates a target value of the residual film thickness of the buried material (positive-type radiosensitive compound film) 7. Symbol $t_1$ denotes a time at which the residual film thickness of the buried material becomes $h_1$. Similarly, $t_2$ denotes a time at which the residual film thickness of the buried material becomes $h_2$, and $t_3$ denotes a time at which the residual film thickness of the buried material becomes 0.

Assume that the absorption coefficient of the positive-type radiosensitive compound film 7 for the wavelength of the radiation 8 applied to the positive-type radiosensitive compound film 7 is $\mu$ $\alpha$ (m$^{-1}$), and the depth from the surface (upper surface) of the positive-type radiosensitive compound film 7 prior to the development treatment is h. Then, the light intensity I can be given by the following formula (3):

$$I = I_0 \exp(-\alpha h) \quad (3)$$

The light intensity I' in the case where an error $\Delta I_0$ is included in the dose is expressed by the following formula (4):

$$I' = (I_0 + \Delta I_0)\exp(-\alpha h) \quad (4)$$

As is shown in FIG. 4, if the depth, at which I meets the condition, $I=I_1$, is $h_0-h_1$, then the depth, at which I' meets the condition, $I'=I_1$, is $h_0-(h_1-\Delta h_1)$. Here, $\Delta h_1$ can be represented by the following formula (5):

$$\Delta h_1 = \frac{\Delta I_0}{\alpha I_0} \quad (5)$$

In this case, since $\Delta h_1$ must not exceed the aforementioned $\Delta h_{total}$, the following formula (6) is established:

$$\frac{\Delta I_0}{\alpha I_0} \leq \Delta h_{total} \Leftrightarrow \alpha \geq \frac{\Delta I_0}{I_0 \Delta h_{total}} \quad (6)$$

The value $\Delta I_0/I_0$ is indicative of the ratio of variance in dose, and this value varies greatly from light source to light source. Assuming a case where the variance in dose is optimally controlled, a value, 0.02, for instance, which is 2% in range, is substituted in $\Delta I_0/I_0$ in formula (6). As mentioned above, in the present embodiment, a maximum value that $\Delta h_{total}$ can take is about 100 nm, and this value is substituted in formula (6). Then, the condition that should be satisfied by the absorption coefficient $\alpha$($\mu m^{-1}$) of the positive-type radiosensitive compound film 7 is expressed by the following formula (7):

$$\alpha \leq 0.2 \ \mu m^{-1} \quad (7)$$

In this embodiment, this condition is required to ensure the controllability of the recess film thickness. According to experiments conducted by the inventors of the present invention, it was understood that the value $\alpha$ meets the condition of formula (7) in this embodiment, and there is no problem.

The above description is directed, by way of example, to the case where single-wavelength monochromatic light is used when the entire surface of the positive-type radiosensitive compound film 7 is exposed. In practice, however, the exposure process may use a light source having plural line spectra or a range of wavelengths.

For example, two combinations are compared. One of the two combinations comprises a resist film $A_R$ and a multi-color light source $A_L$ having the following two bright lines:

Line spectrum A1: $\alpha_{A1}=0.2 \ \mu m^{-1}$, $I_{A10}=0.6 \ I_0$

Line spectrum A2: $\alpha_{A2}=0.1 \ \mu m^{-1}$, $I_{A20}=0.4 \ I_0$.

The other combination comprises a resist film $B_R$ and a monochromatic light source $B_L$ having the following bright line:

Line spectrum B: $\alpha_B=0.2 \ \mu m^{-1}$, $I_{B0}=I_0$.

In comparing these two combinations, assume that the sensitivity of each resist film is constant, regardless of wavelengths.

As is understood from the formulae of the three line spectra, the total intensity I is equal between the light source $A_L$ and light source $B_L$, and also the maximum of the light absorption coefficient $\alpha$ is equal. FIG. 6 is a graph showing, by a solid line and a broken line, light intensity distributions in the depth direction in cases where resist films $A_R$ and $B_R$ are exposed with use of light sources $A_L$ and $B_L$. As is seen from FIG. 6, compared with the light source $B_L$, the light source $A_L$ achieves a gentler light attenuation in the resist film $A_R$.

When a light source emits a light beam with plural wavelengths, like the light source $A_L$, a single light absorption coefficient cannot be defined. It is considered, however, that the substantial light absorption coefficient α is less than 0.2 μm$^{-1}$. Accordingly, it is understood, from the two graph lines in FIG. 6 and formula (4), that the combination of the light source $A_L$ and resist film $A_R$ is unsuitable in this embodiment. In other words, when the present embodiment is reproduced, the use of the light source with monochromatic light can meet the necessary and sufficient condition with the maximum light absorption coefficient $\alpha_{max}$ of about 0.2 μm$^{-1}$. In the case where the light source emits a light beam including a wavelength at which the light absorption coefficient of the resist film becomes about 0.2 μm$^{-1}$ or less, the maximum light absorption coefficient $\alpha_{max}$ has to be greater than about 0.2 μm$^{-1}$. Alternatively, the wavelength component, at which the light absorption coefficient α of the resist film becomes about 0.2 μm$^{-1}$ or less, has to be eliminated by an optical filter (not shown) or the like.

Theoretically, there is no upper limit to the light absorption coefficient of the positive-type radiosensitive compound as the buried material. However, if the light absorption coefficient is too high, a radiation does not easily reach a deep location in the positive-type radiosensitive compound. Hence, an unrealistically great amount of irradiation is required to apply a patterning process to the positive-type radiosensitive compound film 7 with a single operation of irradiation and development. Therefore, in the case where the absorption coefficient of the positive-type radiosensitive compound is much higher than, e.g. 0.2 μm$^{-1}$, it is more desirable to repeat irradiation and development steps than to increase the time for a single irradiation step. Thereby, even in the case where the absorption coefficient of the positive-type radiosensitive compound is much higher than 0.2 μm$^{-1}$, a necessary and sufficient amount of a radiation for recessing can be applied to the positive-type radiosensitive compound, and the radiation can be made to reach a deep location in the positive-type radiosensitive compound film. Furthermore, the processing time needed for the recessing process, and accordingly the processing time for the entire pattern forming steps, can be shortened.

In the case where the radiation source is an electron beam source, it is necessary to properly adjust the electron acceleration voltage, thereby adjusting an electron transmission distance in the positive-type radiosensitive compound film 7, and meeting the formula (2).

As has been described above, in the present embodiment, before processing the to-be-processed film 2 on the basis of the resist pattern formed on the resist film 4, the positive-type radiosensitive compound film 7 is provided on the film 2 such that the resist film 4 is covered. In this case, the positive-type radiosensitive compound film 7 is buried in the resist pattern formed on the resist film 4 such that pattern steps of the resist pattern may substantially be eliminated. The positive-type radiosensitive compound film 7 is then subjected to recessing using an irradiation and development process. Thereby, the recess depth can be controlled at a high level, and the surface (upper surface) of the resist film 4 (upper resist pattern) can be exposed with high in-plane uniformity. By increasing the in-plane uniformity of the exposed resist film 4, the lower limit of the thickness of the resist film 4 can be decreased close to a minimum film thickness of the positive-type radiosensitive compound film 7, which is necessary for processing the to-be-processed film 2. As a result, even in the case where the film thickness of the resist film 4 is too small to perform conventional etch-back, the pattern transfer process of this embodiment is applicable and the to-be-processed film 2 can be patterned with a desired shape and precision. Needless to say, the pattern transfer process of this embodiment is effective in a case where the resist film 4 has such a thickness that conventional etch-back is applicable.

In the prior art, if the thick buried resist film 102 is etched back under the condition, "resist film etching rate>buried resist film etching rate", the in-plane uniformity of etch-back is so poor that the pattern dimension control for the underlying film 103 deteriorates or the processing of the underlying film 103 fails. By contrast, in the present embodiment, the recess depth can be controlled at a high level. Therefore, a thinner resist film 4 than in the prior art can be used, and the processing dimensions of the to-be-processed film 2 can be controlled with higher precision.

The process time (RPT: Raw Process Time) needed for the pattern forming step, e.g. the time for recessing the positive-type radiosensitive compound film 7, can be decreased.

According to the pattern forming method of the present embodiment, the range of applications of the pattern transfer process can be increased, irrespective of the shape of a pattern to be formed. Moreover, the dimension controllability, reproducibility and process efficiency in the pattern transfer can be enhanced, and the patterning can be performed with high precision and efficiency.

A brief description will now be given of a method of manufacturing a semiconductor device according to the first embodiment of the invention. The semiconductor device manufacturing method of this embodiment includes, for example, an etching process based on a pattern formed by the above-described pattern forming method of the present embodiment. According to the pattern forming method of the above-described embodiment, the pattern can be formed with high precision and efficiency. Thus, according to the semiconductor device manufacturing method of the present embodiment, various electronic circuits in the semiconductor device can be formed with high precision and efficiency, and the manufacturing yield in the manufacturing steps of the semiconductor device can be improved. As a result, high-quality semiconductor devices can be manufactured at low cost with high efficiency. In the second to fifth embodiments to be described later, the etching process may be performed on the basis of the pattern formed by the pattern forming method of each embodiment. Thereby, high-quality semiconductor devices can be manufactured at low cost with high efficiency.

(Second Embodiment)

Figure 7:
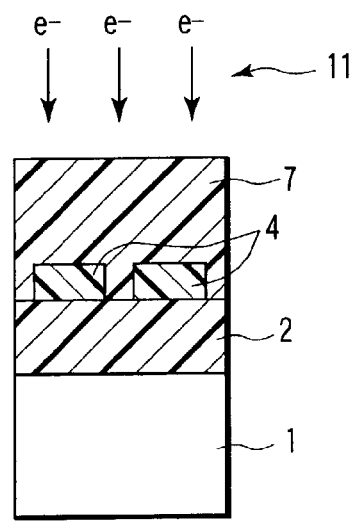
FIG. 7 is a cross-sectional view depicting a step in a pattern forming method according to a second embodiment of the invention.

A second embodiment of the present invention will now be described with reference to FIG. 7. FIG. 7 is a cross-sectional view depicting a step in a pattern forming method according to the second embodiment. The parts common to those in FIGS. 1A to 1I are denoted by like reference numerals, and a detailed description thereof is omitted. A semiconductor device manufacturing method according to the second embodiment is the same as the above-described semiconductor device manufacturing method according to the first embodiment, so a description thereof is omitted. The same applies to the descriptions of third to eighth embodiments which will follow.

The ArF excimer laser beam 8 with a wavelength of about 193 nm is used in the first embodiment in the all-surface exposure step of applying a radiation to the photosensitive polysilazane used as the positive-type radiosensitive compound film. In the second embodiment, the ArF excimer laser beam 8 is replaced with an electron beam 11 with an acceleration voltage of about 10 kV, as shown in FIG. 7. After the electron beam 11 is applied to the entire surface of the photosensitive polysilazane film 7, the photosensitive polysilazane film 7 is subjected to, e.g. development treatment, like the first embodiment.

In the other respects, the second embodiment is common to the first embodiment. As a result, like the state shown in FIG. 1I which has been referred to in describing the first embodiment, a pattern with a desired shape and precision can be formed in the to-be-processed film (coat-type carbon film) 2.

As has been described above, according to the second embodiment, the same advantages as with the first embodiment can be obtained.

(Third Embodiment)

A third embodiment of the present invention will now be described with reference to FIGS. 8A to 8H. FIGS. 8A to 8H are cross-sectional views showing steps of a pattern forming method according to the third embodiment.

In the third embodiment, a DLC (Diamond Like Carbon) film is used as a to-be-processed film. A negative resist film for low-acceleration EB write is used as a resist film. Poly [p-(1,2-dimethyl diphenyl disilanylene)phenylene] is used as the buried material. A low-pressure mercury lamp is used as a light source for irradiating the buried material. The details of the third embodiment will follow.

Figure 8D:
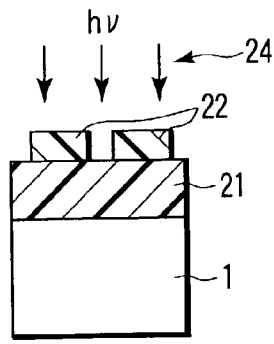
FIG. 8A to FIG. 8H are cross-sectional views illustrating steps of a pattern forming method according to a third embodiment of the present invention.
Figure 8G:
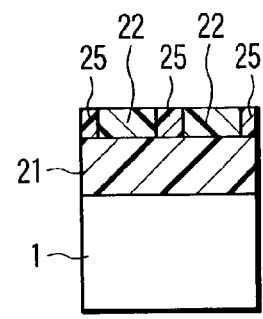
Figure 8A:
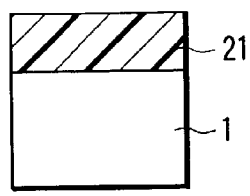

To start with, as shown in FIG. 8A, a DLC (Diamond Like Carbon) film 21 with a thickness of about 0.3 μm, serving as a to-be-processed film, is provided on a semiconductor substrate 1.

Figure 8E:
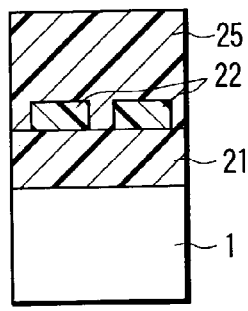
Figure 8B:
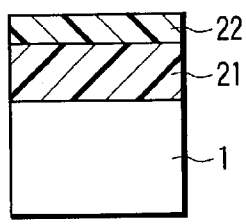

Next, as shown in FIG. 8B, a low-acceleration EB write negative resist film 22 serving as a resist film is spin-coated on the DLC film 21 so as to have a thickness of about 70 nm. The spin-coated negative resist film 22 is then pre-baked.

Figure 8H:
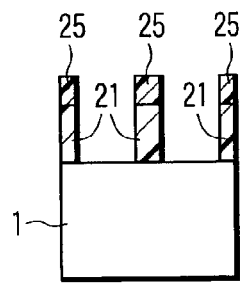
Figure 8C:
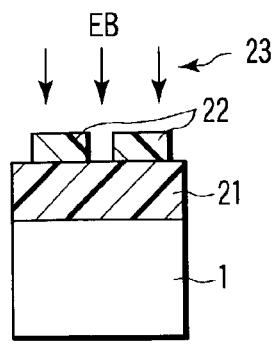

In a step shown in FIG. 8C, an electron beam 23 with an acceleration voltage of about 5 kV is applied to the negative resist film 22, thereby writing a desired pattern. The pattern is then developed. Thus, a resist pattern (upper resist pattern) with a desired shape and precision is formed on the negative resist film 22.

In a step shown in FIG. 8D, ultraviolet 24 with 100 mW/cm$^2$ is applied to the patterned negative film 22 for two minutes, thus performing a UV curing process.

In a step shown in FIG. 8E, a positive-type radiosensitive compound film 25 serving a buried material is provided on the DLC film 21 such that the UV-cured negative resist film 22 is covered. In this embodiment, a film 25 formed of poly [p-(1,2-dimethyl diphenyl disilanylene)phenylene] is used as the positive-type radiosensitive compound film. The poly [p-(1,2-dimethyl diphenyl disilanylene)phenylene] film 25 with a thickness of about 500 nm is spin-coated on the DLC film 21. At this stage, the negative resist film 22 with the resist pattern is coated such that its pattern steps are substantially eliminated. Note that when the negative resist film 22 (upper resist pattern) was covered with the poly [p-(1,2-dimethyl diphenyl disilanylene)phenylene] film 25, it was not dissolved in anisole, i.e. a solvent of the poly [p-(1,2-dimethyl diphenyl disilanylene)phenylene] film 25.

Figure 8F:
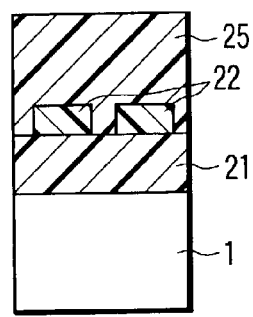

In a step shown in FIG. 8F, a radiation 26 is applied to the poly [p-(1,2-dimethyl diphenyl disilanylene)phenylene] film 25, thereby exposing the entire surface thereof. In the present embodiment, the ArF excimer laser beam 8 with the wavelength of about 193 nm, which is used in the first embodiment, is replaced with a light beam 26 emitted from a low-pressure mercury lamp. In this case, the light beam 26 is filtered through a Vycor glass (not shown) so as to be irradiated monochromatic light that substantially has a wavelength of about 254 nm. Note that the light absorption coefficient of the poly [p-(1,2-dimethyl diphenyl disilanylene)phenylene] film 25 to this wavelength satisfied the condition of about 0.2 μm$^{-1}$ or more.

Subsequently, the poly [p-(1,2-dimethyl diphenyl disilanylene)phenylene] film 25 is subjected to a developing process using an organic solvent. Thus, as shown in FIG. 8G, the upper portion (upper part) of the negative resist film 22 (upper resist pattern) is exposed. As a result, a pattern with a desired shape and precision is formed in the poly [p-(1,2-dimethyl diphenyl disilanylene)phenylene] film 25. In addition, the film decrease rate of the recess immediately before the end of development satisfied the condition of about 100 nm/sec or less, and the recess depth was controlled with high precision.

At last, as shown in FIG. 8H, using the poly [p-(1,2-dimethyl diphenyl disilanylene)phenylene] film 25 as a mask, the negative resist film 22 and DLC film 21, in the region where the film 25 is not left, are removed by processing. Thereby, a pattern with a desired shape and precision can be formed in the DLC film 21 left on the semiconductor substrate 1.

As has been described above, according to the third embodiment, the same advantages as with the above-described first embodiment can be obtained.

(Fourth Embodiment)

Figure 9:
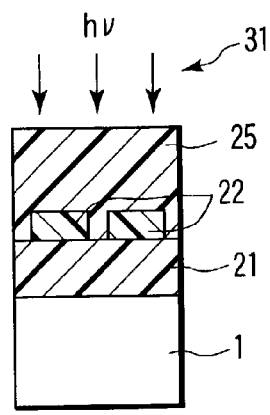
FIG. 9 is a cross-sectional view depicting a step in a pattern forming method according to a fourth embodiment of the invention.

A fourth embodiment of the present invention will now be described with reference to FIG. 9. FIG. 9 is a cross-sectional view depicting a step in a pattern forming method according to the fourth embodiment.

The fourth embodiment differs from the third embodiment in the following respects. In the third embodiment, the light beam 26 emitted from the low-pressure mercury lamp, which is composed of filtered monochromatic light, is used in the all-surface exposure step of applying a radiation to the poly [p-(1,2-dimethyl diphenyl disilanylene)phenylene] film 25 serving as the positive-type radiosensitive compound film. In the fourth embodiment, the light beam 26 is replaced with a light beam 31 emitted from a Xe$_2$ excimer lamp, as shown in FIG. 9. In addition, the all-surface exposure step using the light beam 31 of the Xe$_2$ excimer lamp 31 and the subsequent developing step are performed twice, in the process of exposing the upper part (upper surface) of the low-acceleration EB write negative resist film 22 used as the resist film, as shown in FIG. 8G referred to in the description of the third embodiment.

In the other respects, the fourth embodiment is common to the third embodiment. As a result, like the state shown in FIG. 8H which has been referred to in describing the third embodiment, a pattern with a desired shape and precision can be formed in the to-be-processed film (DLC film) 21.

As has been described above, according to the fourth embodiment, the same advantages as with the first embodiment can be obtained.

(Fifth Embodiment)

Figure 10:
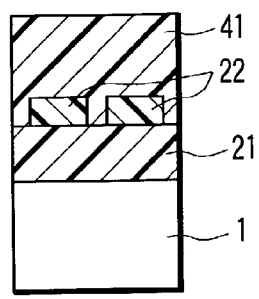
FIG. 10 is a cross-sectional view depicting a step in a pattern forming method according to a fifth embodiment of the invention.

A fifth embodiment of the present invention will now be described with reference to FIG. 10. FIG. 10 is a cross-sectional view depicting a step in a pattern forming method according to the fifth embodiment.

In the fifth embodiment, the poly [p-(1,2-dimethyl diphenyl disilanylene)phenylene] film 25 used in the third embodiment as the positive-type radiosensitive compound film serving as the buried material is replaced with a polydiphenyl silane 41, as shown in FIG. 10.

In the other respects, the fifth embodiment is common to the third embodiment. As a result, like the state shown in FIG. 8H which has been referred to in describing the third embodiment, a pattern with a desired shape and precision can be formed in the to-be-processed film (DLC film) 21.

As has been described above, according to the fifth embodiment, the same advantages as with the first embodiment can be obtained.

(Sixth Embodiment)

Figure 11:
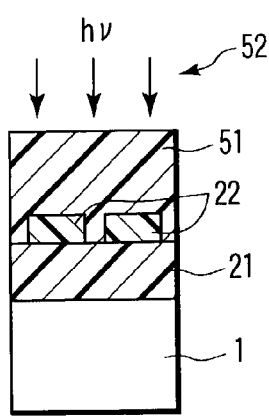
FIG. 11 is a cross-sectional view depicting a step in a pattern forming method according to a sixth embodiment of the invention.

A sixth embodiment of the present invention will now be described with reference to FIG. 11. FIG. 11 is a cross-sectional view depicting a step in a pattern forming method according to the sixth embodiment.

The sixth embodiment differs from the third embodiment in the following respects. In the third embodiment, the poly [p-(1,2-dimethyl diphenyl disilanylene)phenylene] film 25 is used as the positive-type radiosensitive compound film serving as the buried material. In the sixth embodiment, this film 25 is replaced with a film 51 formed of a mixture in which 2,3,4,4'-tetrahydroxybenzophenone-1,2-naphthoquinone diazide-5-sulfonic ester is added as an additive to polymethylsiloxane. In addition, in the third embodiment, the light beam 26 emitted from the low-pressure mercury lamp, which is composed of filtered monochromatic light, is used in the all-surface exposure step of applying a radiation to the positive-type radiosensitive compound film. In the sixth embodiment, however, the light beam 26 is replaced with a light beam 52 emitted from a high-pressure mercury lamp, as shown in FIG. 11.

In the other respects, the sixth embodiment is common to the third embodiment. As a result, like the state shown in FIG. 8H which has been referred to in describing the third embodiment, a pattern with a desired shape and precision can be formed in the to-be-processed film (DLC film) 21.

As has been described above, according to the sixth embodiment, the same advantages as with the first embodiment can be obtained.

(Seventh Embodiment)

A seventh embodiment of the present invention will now be described without referring to drawings.

The seventh embodiment differs from the third embodiment in the following respects. In the third embodiment, the poly [p-(1,2-dimethyl diphenyl disilanylene)phenylene] film 25 is used as the positive-type radiosensitive compound film serving as the buried material. In the seventh embodiment, this film 25 is replaced with a film formed of a polyhydroxystyrene resin including a silicon (Si) atom in a substitute group of a benzene ring. In addition, in the third embodiment, the light beam 26 emitted from the low-pressure mercury lamp, which is composed of filtered monochromatic light, is used in the all-surface exposure step of applying a radiation to the positive-type radiosensitive compound film. In the seventh embodiment, like the sixth embodiment, the light beam 26 is replaced with a light beam emitted from a high-pressure mercury lamp.

In the other respects, the seventh embodiment is common to the third embodiment. As a result, like the state shown in FIG. 8H which has been referred to in describing the third embodiment, a pattern with a desired shape and precision can be formed in the to-be-processed film (DLC film) 21.

As has been described above, according to the seventh embodiment, the same advantages as with the first embodiment can be obtained.

(Eighth Embodiment)

An eighth embodiment of the present invention will now be described with reference to FIGS. 12A to 12H. FIGS. 12A to 12H are cross-sectional views showing steps of a pattern forming method according to the eighth embodiment.

In the eighth embodiment, a sputter carbon film is used as a to-be-processed film. A KrF negative resist film is used as a resist film. A polysiloxane resin containing a photosensitive composition, which is disclosed in Example 2 of Jpn. Pat. Appln. KOKAI Publication No. 62-229136, is used as the buried material. A KrF excimer laser is used as a light source for irradiating the buried material. The details of the eighth embodiment will follow.

To start with, as shown in FIG. 12A, a sputter carbon film 61 with a thickness of about 0.3 μm, serving as a to-be-processed film, is provided on a semiconductor substrate 1.

Then, as shown in FIG. 12B, a KrF negative resist film 62 (TDUR-N620) manufactured by Tokyo Ohka Kogyo, serving as a resist film, is spin-coated on the sputter carbon film 61 so as to have a thickness of about 150 nm. The spin-coated negative resist film 62 is pre-baked.

In a step shown in FIG. 12C, the KrF negative resist film 62 is exposed using a KrF exposing apparatus (not shown), and then it is developed. Thus, a resist pattern (upper resist pattern) with a desired shape and precision is formed on the KrF negative resist film 62.

In a step shown in FIG. 12D, an electron beam 6 with 4 mC/cm$^2$ is applied to the patterned KrF negative film 62, thus performing an EB curing process.

In a step shown in FIG. 12E, a positive-type radiosensitive compound film 63 serving a buried material is provided on the sputter carbon film 61 such that the EB-cured KrF negative resist film 62 is covered. In this embodiment, a film 63 formed of a polysiloxane resin containing a photosensitive composition, which is disclosed in Example 2 of Jpn. Pat. Appln. KOKAI Publication No. 62-229136, is used as the positive-type radiosensitive compound film. The polysiloxane resin film 63 with a thickness of about 300 nm is spin-coated on the sputter carbon film 61. At this stage, the KrF negative resist film 62 with the resist pattern is coated such that its pattern steps are substantially eliminated. Note that when the KrF negative resist film 62 (upper resist pattern) was covered with the polysiloxane resin film 63, it was not dissolved in cyclohexanone, i.e. a solvent of the polysiloxane resin film 63.

In a step shown in FIG. 12F, a radiation 64 is applied to the polysiloxane resin film 63, thereby exposing the polysiloxane resin film 63. In this case, the polysiloxane resin film 63 is partially exposed using a mask 65 and the KrF exposing apparatus, which have been used for exposing the KrF negative resist film 62. In the present embodiment, the ArF excimer laser beam 8 with the wavelength of about 193 nm, which is used in the first embodiment, is replaced with a KrF excimer laser beam 64 with a wavelength of about 248 nm. Note that the light absorption coefficient of the polysiloxane resin film 63 containing the photosensitive composition, which is disclosed in Example 2 of Jpn. Pat. Appln. KOKAI Publication No. 62-229136, to the wavelength of the KrF excimer laser beam 64 satisfied the condition of about 0.2 μm$^{-1}$ or more.

Subsequently, the polysiloxane resin film 63 is subjected to a developing process using an approximately 1.5% aqueous solution of tetramethylammonium hydroxide. Thus, as shown in FIG. 12G, the upper portion (upper part) of the KrF negative resist film 62 (upper resist pattern) is exposed. As a result, a pattern with a desired shape and precision is formed in the polysiloxane resin film 63. In addition, the film decrease rate of the recess immediately before the end of development satisfied the condition of about 100 nm/sec or less, and the recess depth was controlled with high precision.

At last, as shown in FIG. 12H, using the polysiloxane resin film 63 as a mask, the KrF negative resist film 62 and sputter carbon film 61, in the region where the film 63 is not left, are removed by processing. Thereby, a pattern with a desired shape and precision can be formed in the sputter carbon film 61 left on the semiconductor substrate 1.

As has been described above, according to the eighth embodiment, the same advantages as with the above-described first embodiment can be obtained.

(Ninth Embodiment)

Figure 13A:
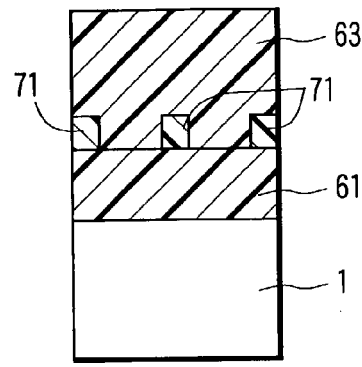
FIG. 13A and FIG. 13B are cross-sectional views depicting some steps in a pattern forming method according to a ninth embodiment of the invention.
Figure 13B:
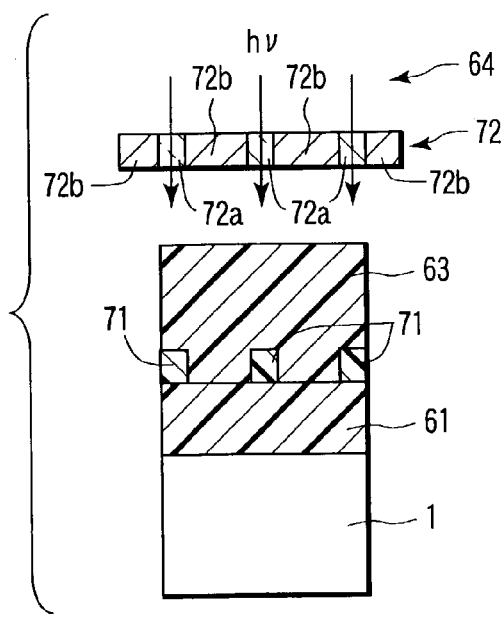

A ninth embodiment of the present invention will now be described with reference to FIG. 13A and FIG. 13B. FIG. 13A and FIG. 13B are cross-sectional views depicting steps in a pattern forming method according to the ninth embodiment.

In the ninth embodiment, a KrF positive-type resist (KRF V210G) 71 manufactured by JSR Corp., as shown in FIG. 13A, is substituted for the KrF negative resist film 62 (TDUR-N620) manufactured by Tokyo Ohka Kogyo, which is used as the resist film in the eighth embodiment. In addition, as shown in FIG. 13B, a mask 72, wherein a transmission portion 72a and a shield portion 72b are reversed compared to the mask 65 used in the eighth embodiment, is used in the step of recess-exposing the polysiloxane resin film 63 containing the photosensitive composition, which serves as the positive-type radiosensitive compound film and is disclosed in Example 2 of Jpn. Pat. Appln. KOKAI Publication No. 62-229136.

In the other respects, the ninth embodiment is common to the eighth embodiment. As a result, like the state shown in FIG. 12H which has been referred to in describing the eighth embodiment, a pattern with a desired shape and precision can be formed in the sputter carbon film 61.

As has been described above, according to the ninth embodiment, the same advantages as with the first embodiment can be obtained.

(Tenth Embodiment)

A tenth embodiment of the present invention will now be described with reference to FIG. 14A to FIG. 14H. FIGS. 14A to 14H are cross-sectional views showing steps of a pattern forming method according to the tenth embodiment. The steps illustrated in FIGS. 14A to 14H correspond to those depicted in FIGS. 12A to 12H, which have been referred to in describing the eighth embodiment.

In the tenth embodiment, as shown in FIG. 14A to FIG. 14H, a polysiloxane resin film 81 containing a photosensitive composition, which is disclosed in Example 1 of Jpn. Pat. Appln. KOKAI Publication No. 62-229136, is substituted for the polysiloxane resin film 63 containing the photosensitive composition, which is used in the eighth embodiment as the radiosensitive compound film that becomes the buried material and is disclosed in Example 2 of Jpn. Pat. Appln. KOKAI Publication No. 62-229136. The film 81 is a negative-type radiosensitive compound film. In addition, as shown in FIG. 14F, the mask 72 used in the recess-exposing step in the ninth embodiment illustrated in FIG. 13B is also used in the step of recess-exposing the negative-type radiosensitive compound film 81.

In the other respects, the tenth embodiment is common to the eighth embodiment. As a result, as shown in FIG. 14H, a pattern with a desired shape and precision can be formed in the sputter carbon film 61.

As has been described above, according to the tenth embodiment, the same advantages as with the first embodiment can be obtained.

(Eleventh Embodiment)

An eleventh embodiment of the present invention will now be described with reference to FIG. 15A to FIG. 15H. FIGS. 15A to 15H are cross-sectional views showing steps of a pattern forming method according to the eleventh embodiment.

In the eleventh embodiment, after a to-be-processed film is formed on a substrate, an antireflection film is formed on the to-be-processed film prior to the formation of a resist film over the to-be-processed film. In addition, the antireflection film together with the resist film is removed. Details of the eleventh embodiment will follow.

Figure 15A:
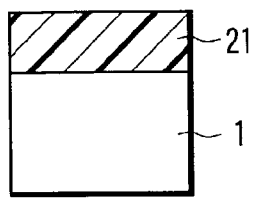
FIG. 15A to FIG. 15H are cross-sectional views illustrating steps of a pattern forming method according to an eleventh embodiment of the invention.

To start with, as shown in FIG. 15A, like the third embodiment, a DLC film 21 with a thickness of about 0.3 μm, serving as a to-be-processed film, is provided on a semiconductor substrate 1.

Figure 15D:
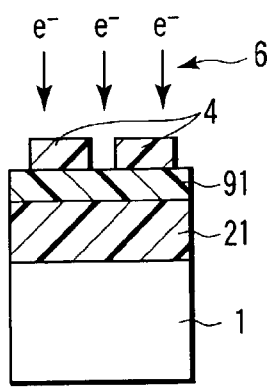
Figure 15B:
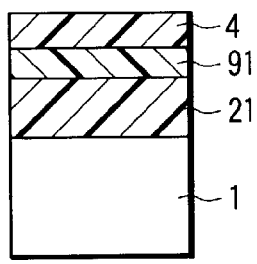

Next, as shown in FIG. 15B, an antireflection film (tradename: AR19) 91 manufactured by Shipley Far East, Ltd., with a thickness of about 85 nm, is spin-coated on the DLC film 21. The antireflection film 91 is then pre-backed. Subsequently, like the first embodiment, a positive-type ArF resist film 4 manufactured by JSR Corp. (tradename: ATB367S) with a thickness of about 120 nm, which serves as an upper resist film, is spin-coated on the baked antireflection film 91. The positive-type ArF resist film 4 is then pre-baked.

Figure 15E:
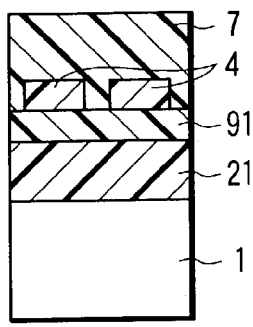
Figure 15G:
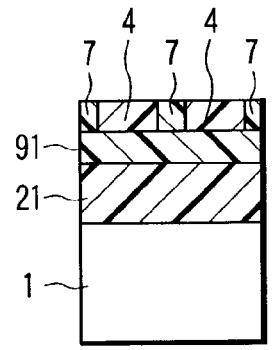
Figure 15C:
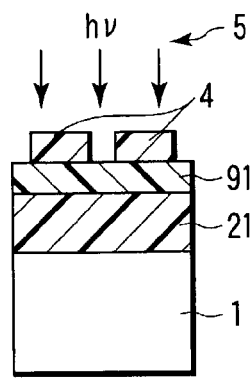

In a step shown in FIG. 15C, like the first embodiment, an ArF excimer laser beam 5 irradiates on the positive-type ArF resist film 4, following which the resist film 4 is developed. Thereby, the positive-type ArF resist film 4 is patterned to have a resist pattern (upper layer resist pattern) with a desired shape and precision.

In a step illustrated in FIG. 15D, the patterned positive-type ArF resist film 4 is subjected to an EB curing process so as to provide the resist film 4 with a resistance to a solvent of a radiosensitive compound used as a buried material. In the present embodiment, like the first embodiment, an electron beam (e⁻) 6 with 4 mC/cm² irradiates on the positive-type ArF resist film 4.

In the following step depicted in FIG. 15E, a film 7 formed of a radiosensitive compound as a buried material is provided on the antireflection film 91 such that the EB-cured positive-type ArF resist film 4 is covered. In this embodiment, like the first embodiment, a photosensitive polysilazane film 7 manufactured by Clariant (Japan) K.K. (tradename: PS-MSZ) is used as the radiosensitive compound film. The photosensitive polysilazane film 7 with a thickness of about 500 nm is spin-coated on the antireflection film 91. At this stage, the positive-type ArF resist film 4, which is patterned to have a resist pattern, is covered with the photosensitive polysilazane film 7 such that stepped portions of the pattern may be almost completely eliminated. Note that when the positive-type ArF resist film 4 (upper resist pattern) was covered with the photosensitive polysilazane film 7, it was not dissolved in propylene glycol monoethyl ether acetate (PGMEA), i.e. a solvent of the photosensitive polysilazane film 7.

Figure 15F:
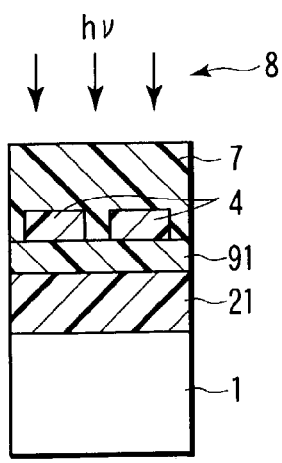

In a subsequent step shown in FIG. 15F, like the first embodiment, an ArF excimer laser beam 8 is applied to the photosensitive polysilazane film 7, thus exposing the entire surface of the photosensitive polysilazane film 7. Note that in the exposure, the absorption coefficient of the photosensitive polysilazane film 7 for the wavelength of the ArF excimer laser beam 8 was about 6.5 μm⁻¹.

Next, like the first embodiment, the photosensitive polysilazane film 7 is subjected to humidifying treatment and development treatment so that the residual film after the development may have a thickness of about 100 nm. Thereby, the upper part (upper surface) of the positive-type ArF resist film 4 (upper resist pattern) is exposed, as shown in FIG. 15G. As a result, a pattern with a desired shape and precision is formed in the photosensitive polysilazane film 7. Note that the in-plane uniformity (width of projection/recess) on the exposed surface (upper surface) of each of the positive-type ArF resist film 4 and photosensitive polysilazane film 7 after the development was within about 10 nm. In addition, the film decrease rate of the recess immediately before the end of development was about 1 nm/sec.

Figure 15H:
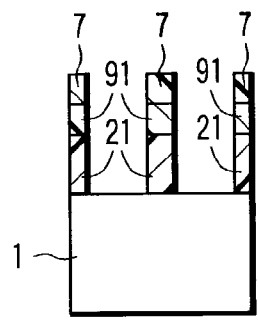
Figure 16A:
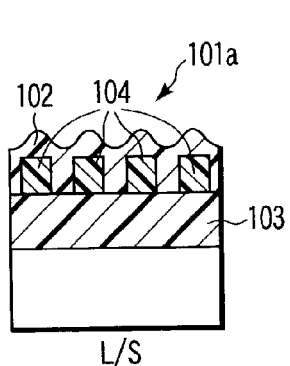
FIG. 16A to FIG. 16C are cross-sectional views showing structures near resist patterns according to prior art.
Figure 16B:
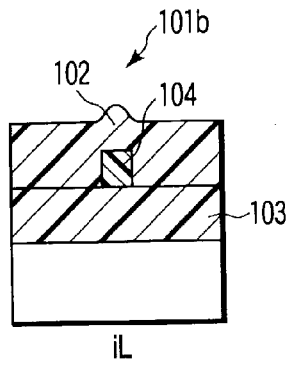
Figure 16C:
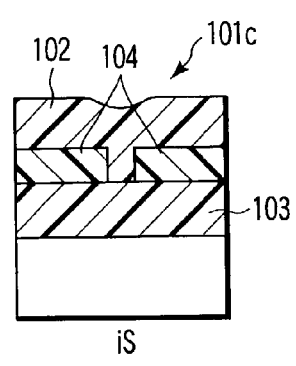
Figure 17A:
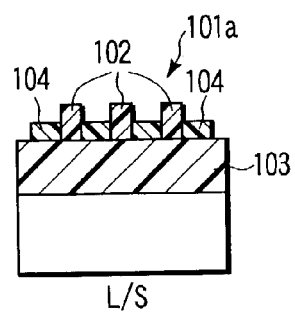
FIG. 17A to FIG. 17C are cross-sectional views showing structures near resist patterns according to prior art.
Figure 17B:
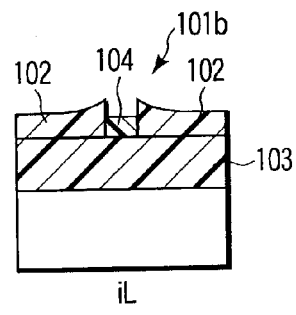
Figure 17C:
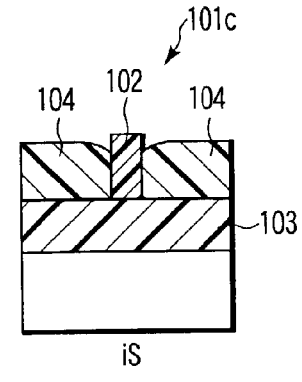
Figure 18A:
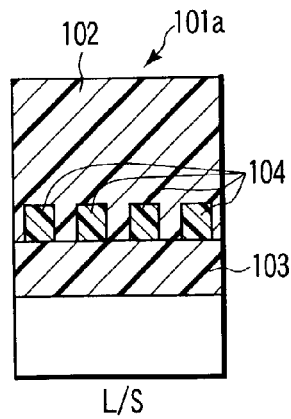
FIG. 18A to FIG. 18C are cross-sectional views showing structures near resist patterns according to prior art.
Figure 18B:
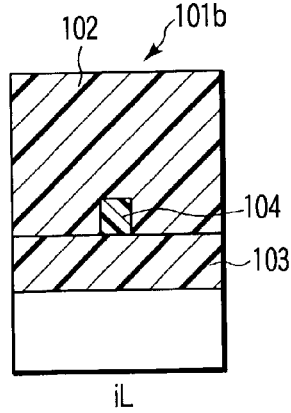
Figure 18C:
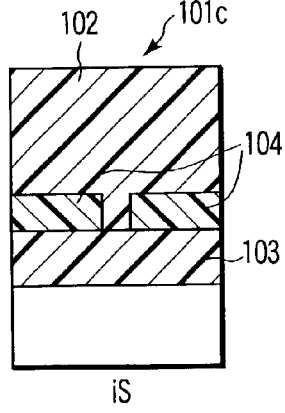

At last, as shown in FIG. 15H, using the photosensitive polysilazane film 7 as a mask, the positive-type ArF resist film 4, antireflection film 91 and DLC film 21, in the region where no photosensitive polysilazane film 7 is left, are removed by processing. Thereby, a pattern with a desired shape and precision can be formed in the DLC film 21 left on the semiconductor substrate 1.

As has been described above, according to the eleventh embodiment, the same advantages as with the first embodiment can be obtained. Even in the case where the DLC film 21 with high reflectance is used as the to-be-processed film, a pattern with a desired shape and precision can be formed in the DLC film 21 by providing the antireflection film 91 between the DLC film 21 and positive-type ArF resist film 4, as in the present embodiment.

The pattern forming method and semiconductor device manufacturing method according to the present invention are not limited to the above-described first to eleventh embodiments. Without departing from the spirit of the present invention, portions of the structures or steps in these embodiments can be variously modified, or various settings can be properly combined.

For example, the coating method or sputtering method is used to form a to-be-processed film on the semiconductor substrate in the embodiments. However, this invention is not limited to these methods. The to-be-processed film may be formed by using, for instance, arc discharge, microwave ECR (Electron Cyclotron Resonance), pulse laser evaporation, or chemical vapor deposition (CVD).

In the embodiments, the resist films used are the ArF positive resist film, low-acceleration EB write negative resist film, KrF negative resist film, and the KrF positive resist film, and each of these resist films is patterned by using the ArF excimer laser beam, electron beam or KrF laser beam. However, the present invention is not limited to these embodiments. Alternatively, a resist film, such as a g-ray resist film, an i-ray resist film, an $F_2$ resist film, an EB resist film, an X-ray resist film, a proximity-field photolithography resist film or a nano-imprint resist film, may be used, and each resist film may be patterned using a radiation having an energy line or energy type corresponding to the resist film.

In the embodiments, the radiosensitive compounds used as buried material are photosensitive polysilazane, poly[p-(1,2-dimethyl diphenyl disilanylene)phenylene], polydiphenyl silane, a mixture in which 2,3,4,4'-tetrahydroxybenzophenone-1,2-naphthoquinone diazide-5-sulfonic ester is added as an additive to polymethylsiloxane, a polyhydroxystyrene resin including a silicon (Si) atom in a substitute group of a benzene ring, and polysiloxane resins containing photosensitive compositions disclosed in Examples 1 and 2 of Jpn. Pat. Appln. KOKAI Publication No. 62-229136. However, the present invention is not limited to these instances. Other usable buried materials are, for instance, an acrylic resin derivative including a silicon atom, a methacrylic resin derivative including a silicon atom, a COMA (cyclo olefin maleic anhydride) resin derivative including a silicon atom, and polytungstic acid peroxide.

Alternatively, radiosensitive compounds disclosed in the following publications may be used: Jpn. Pat. Appln. KOKAI Publication No. 61-3139; Jpn. Pat. Appln. KOKAI Publication No. 62-159142; Jpn. Pat. Appln. KOKAI Publication No. 62-229136 (except Examples 1 and 2); Jpn. Pat. Appln. KOKAI Publication No. 60-119549; Jpn. Pat. Appln. KOKAI Publication No. 60-212757; Jpn. Pat. Appln. KOKAI Publication No. 61-7835; Jpn. Pat. Appln. KOKAI Publication No. 61-289345; Jpn. Pat. Appln. KOKAI Publication No. 62-229141; Jpn. Pat. Appln. KOKAI Publication No. 62-212644; Jpn. Pat. Appln. KOKAI Publication No. 60-14238; J. Photopolym. Sci. & Technol., 651 (1998); J. Photopolym. Sci. & Technol., 667 (1998); SPIE Vol. 2438, 775 (1995); SPIE Vol. 3333, 62 (1998); Jpn. J. Appl. Phys. Vol. 34, 6950 (1995); Jpn. J. Appl. Phys. Vol. 34, 6961 (1995); and Jpn. J. Appl. Phys. Vol. 35, 6673 (1996).

Alternatively, a mixture of any of the above-listed compounds and a radiosensitive substance may be used.

In the embodiments, the radiations used in recessing the radiosensitive compound as the buried material are an ArF excimer laser beam, an electron beam, a low-pressure mercury lamp light beam, a $Xe_2$ excimer lamp light beam, a high-pressure mercury lamp light beam and a KrF excimer laser beam. The present invention is not limited to these instances. Alternatively, light beams of other kinds of lamps, or various laser beams may be used. The following radiations may be used for recessing: an $Ar_2$ excimer lamp light beam, a $Kr_2$ excimer lamp light beam, a KrCl excimer lamp light beam, a XeCl excimer lamp light beam, an iodine lamp light beam, a bromine lamp light beam, an $F_2$ excimer laser beam, a XeCl excimer laser beam, an Ar laser beam, an $N_2$ laser beam, a fundamental harmonic of an ND-YAG laser beam, a second harmonic of the ND-YAG laser beam, a third harmonic of the ND-YAG laser beam, and a fourth harmonic of the ND-YAG laser beam.

In the embodiments, the radiation-applying methods used for recessing the radiosensitive compound films are a method wherein the entire surface of the radiosensitive compound film is irradiated, a method wherein the same mask as is used in forming the upper resist pattern is used, and a method wherein a mask, whose transmission portion and shield portion are reversed compared to the mask used in forming the upper resist pattern, is used. The present invention is not limited to these methods. When the positive-type radiosensitive compound film is irradiated, a method may be adopted which uses a shield so formed that the dose on an area, where an upper resist film is not present over a wide range, is less than the dose on the other area in the region where the upper resist pattern is formed.

In the embodiments, the alkali solution development method and organic solvent development method are exemplified as development methods for developing the radiosensitive compound film as the buried material. This invention is not limited to these methods. When the buried material is developed, a water development method or an acid development method, for instance, may be used in accordance with properties of the buried material.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A pattern forming method comprising:
providing a to-be-processed film on a substrate;
providing a resist film on the to-be-processed film;
patterning the resist film;
providing a film of a radiosensitive compound on the to-be-processed film such that the patterned resist film is covered with the film of the radiosensitive compound;
subjecting the film of the radiosensitive compound to irradiation and a development process, thus exposing an upper surface of the resist film and patterning the film of the radiosensitive compound; and
removing the resist film and processing the to-be-processed film, using the patterned film of the radiosensitive compound as a mask.

2. The method according to claim 1, wherein the radiosensitive compound includes one or more selected from the group consisting of a silicon atom, a germanium atom, a tin atom, and a tungsten atom.

3. The method according to claim 2, wherein the radiosensitive compound is:
  (i) one selected from the group consisting of: radiosensitive polysilane, radiosensitive polygermane, radiosensitive polystannane, radiosensitive polysilazane, radiosensitive polysiloxane, radiosensitive polycarbosilane, a radiosensitive disilanylene-π-electron series polymer, and a copolymer of two or more of these radiosensitive compounds;
  (ii) one selected from the group consisting of: a novolak resin including a silicon atom in a substitute group of a benzene ring, a polyhydroxystyrene resin including a silicon atom in a substitute group of a benzene ring, an acrylic resin derivative including a silicon atom, a methacrylic resin derivative including a silicon atom, a COMA (cyclo olefin maleic anhydride) resin derivative including a silicon atom, and polytungstic acid peroxide; or
  (iii) one selected from the group consisting of mixtures of materials recited in (i) and (ii).

4. The method according to claim 1, wherein after the resist film is patterned, the patterned resist film is subjected to a process for providing the patterned resist film with a resistance to a solvent of the radiosensitive compound, prior to the provision of the film of the radiosensitive compound on the to-be-processed film.

5. The method according to claim 4, wherein the process for providing the patterned resist film with the resistance to the solvent of the radiosensitive compound is effected by one or more selected from the group consisting of electron beam irradiation, ultraviolet irradiation, radical irradiation, molecular beam irradiation, and heat treatment.

6. The method according to claim 1, wherein a radiation used for the irradiation is one of a light beam, an electron beam and an ion beam.

7. The method according to claim 6, wherein the light beam is one selected from the group consisting of infrared, visible light, ultraviolet, vacuum ultraviolet, extreme ultraviolet, and soft X-rays.

8. The method according to claim 1, wherein when the thickness of the film of the radiosensitive compound is decreased by the development process to a thickness of the film of the radiosensitive compound to be left, a dose of irradiation for the irradiation is set such that a development rate in the development process is 100 nm/sec or less.

9. The method according to claim 1, wherein the radiosensitive compound is a positive-type radiosensitive compound.

10. The method according to claim 9, wherein when the irradiation is effected, a dose of the radiation on an area where the patterned resist film is absent is set to be equal to or less than a dose of the radiation on an area where the patterned resist film is present, the area where the patterned resist film is present being adjacent to the area where the patterned resist film is absent.

11. The method according to claim 9, wherein in a case where the light beam is used as the radiation for effecting the irradiation, the positive-type radiosensitive compound is used which has a light absorption coefficient of 0.2 $\mu m^{-1}$ or more for a wavelength of wavelengths included in the light beam, at which wavelength the positive-type radiosensitive compound has a maximum light absorption coefficient.

12. The method according to claim 9, wherein when the film of the positive-type radiosensitive compound is patterned, the irradiation and the development process are repeated twice or more.

13. The method according to claim 1, wherein the radiosensitive compound is a negative-type radiosensitive compound.

14. The method according to claim 13, wherein when the irradiation is effected, a dose of the radiation on an area where the patterned resist film is absent is set to be equal to or more than a dose of the radiation on an area where the patterned resist film is present, the area where the patterned resist film is present being adjacent to the area where the patterned resist film is absent.

15. The method according to claim 1, wherein after the to-be-processed film is formed on the substrate, an antireflection film is formed on the to-be-processed film prior to the provision of the resist film over the to-be-processed film, and the antireflection film together with the resist film is removed.

16. A method of manufacturing a semiconductor device, comprising:
providing a to-be-processed film on a substrate;
providing a resist film on the to-be-processed film;
patterning the resist film;
providing a film of a radiosensitive compound on the to-be-processed film such that the patterned resist film is covered with the film of the radiosensitive compound;
subjecting the film of the radiosensitive compound to irradiation and a development process, thus exposing an upper surface of the resist film and patterning the film of the radiosensitive compound;
removing the resist film, processing the to-be-processed film and forming a pattern thereon, using the patterned film of the radiosensitive compound as a mask; and
performing an etching process on the basis of the formed pattern.

17. The method according to claim 16, wherein the radiosensitive compound includes one or more selected from the group consisting of a silicon atom, a germanium atom, a tin atom, and a tungsten atom.

18. The method according to claim 17, wherein the radiosensitive compound is:
  (i) one selected from the group consisting of: radiosensitive polysilane, radiosensitive polygermane, radiosensitive polystannane, radiosensitive polysilazane, radiosensitive polysiloxane, radiosensitive polycarbosilane, a radiosensitive disilanylene-π-electron series polymer, and a copolymer of two or more of these radiosensitive compounds;

(ii) one selected from the group consisting of: a novolak resin including a silicon atom in a substitute group of a benzene ring, a polyhydroxystyrene resin including a silicon atom in a substitute group of a benzene ring, an acrylic resin derivative including a silicon atom, a methacrylic resin derivative including a silicon atom, a COMA (cyclo olefin maleic anhydride) resin derivative including a silicon atom, and polytungstic acid peroxide; or (iii) one selected from the group consisting of mixtures of materials recited in (i) and (ii).

* * * * *